(12) United States Patent
Purohit et al.

(10) Patent No.: US 8,023,247 B2
(45) Date of Patent: Sep. 20, 2011

(54) ELECTROSTATIC CHUCK WITH COMPLIANT COAT

(75) Inventors: Ashwin M. Purohit, Gloucester, MA (US); Marvin R. LaFontaine, Kingston, NH (US); William D. Lee, Newburyport, MA (US); Richard J. Rzeszut, Billerica, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 319 days.

(21) Appl. No.: 12/331,813

(22) Filed: Dec. 10, 2008

(65) Prior Publication Data

US 2010/0142114 A1    Jun. 10, 2010

(51) Int. Cl.
*H01L 21/683* (2006.01)
*C23C 16/42* (2006.01)
(52) U.S. Cl. ...................... 361/234; 427/255.6
(58) Field of Classification Search .............. 361/234; 427/255.6
See application file for complete search history.

(56) References Cited

U.S. PATENT DOCUMENTS

| 7,108,591 | B1* | 9/2006 | Boyd et al. | 451/285 |
| 7,541,826 | B2* | 6/2009 | Koliopoulos et al. | 324/762.01 |
| 2004/0131775 | A1* | 7/2004 | Blaedel et al. | 427/255.6 |
| 2006/0057350 | A1* | 3/2006 | Ochi et al. | 428/292.1 |
| 2007/0217117 | A1* | 9/2007 | Ohta et al. | 361/234 |
| 2010/0209687 | A1* | 8/2010 | Zhu | 428/220 |

OTHER PUBLICATIONS

NxEdge Semiconductor. "Precision Manufacturing." Fluoropolymers Jul. 2006.*

* cited by examiner

*Primary Examiner* — Rexford Barnie
*Assistant Examiner* — Scott Bauer
(74) *Attorney, Agent, or Firm* — Eschweiler & Associates, LLC (57) ABSTRACT

The present invention is directed to an electrostatic chuck (ESC) with a compliant layer formed from TT-Kote® and a method of forming a clamping plate for an ESC. The ESC comprises a compliant layer having a low friction surface for reducing or eliminating particulates generated from thermal expansion. The method comprises forming a clamping member for a substrate comprising a ceramic material and a ceramic surface, and coating the ceramic surface with a compliant layer comprising an organic silicide or TT-Kote®.

11 Claims, 5 Drawing Sheets

ELECTROSTATIC CHUCK WITH COMPLIANT COAT

FIELD

The present invention relates generally to semiconductor processing systems, and more specifically to an apparatus and method for manufacturing an electrostatic chuck for clamping a substrate and transferring thermal energy associated therewith.

BACKGROUND

Processing of silicon wafers is commonplace in the manufacture of modern microelectronics devices. Such processing, including plasma processing and ion implantation may be performed at low pressures, wherein RF or microwave plasmas, or high-power particle beams are delivered to the wafer, therein producing high temperatures at the wafer during processing. Such high temperatures, however, can have deleterious effects on the wafer.

Figure 1:
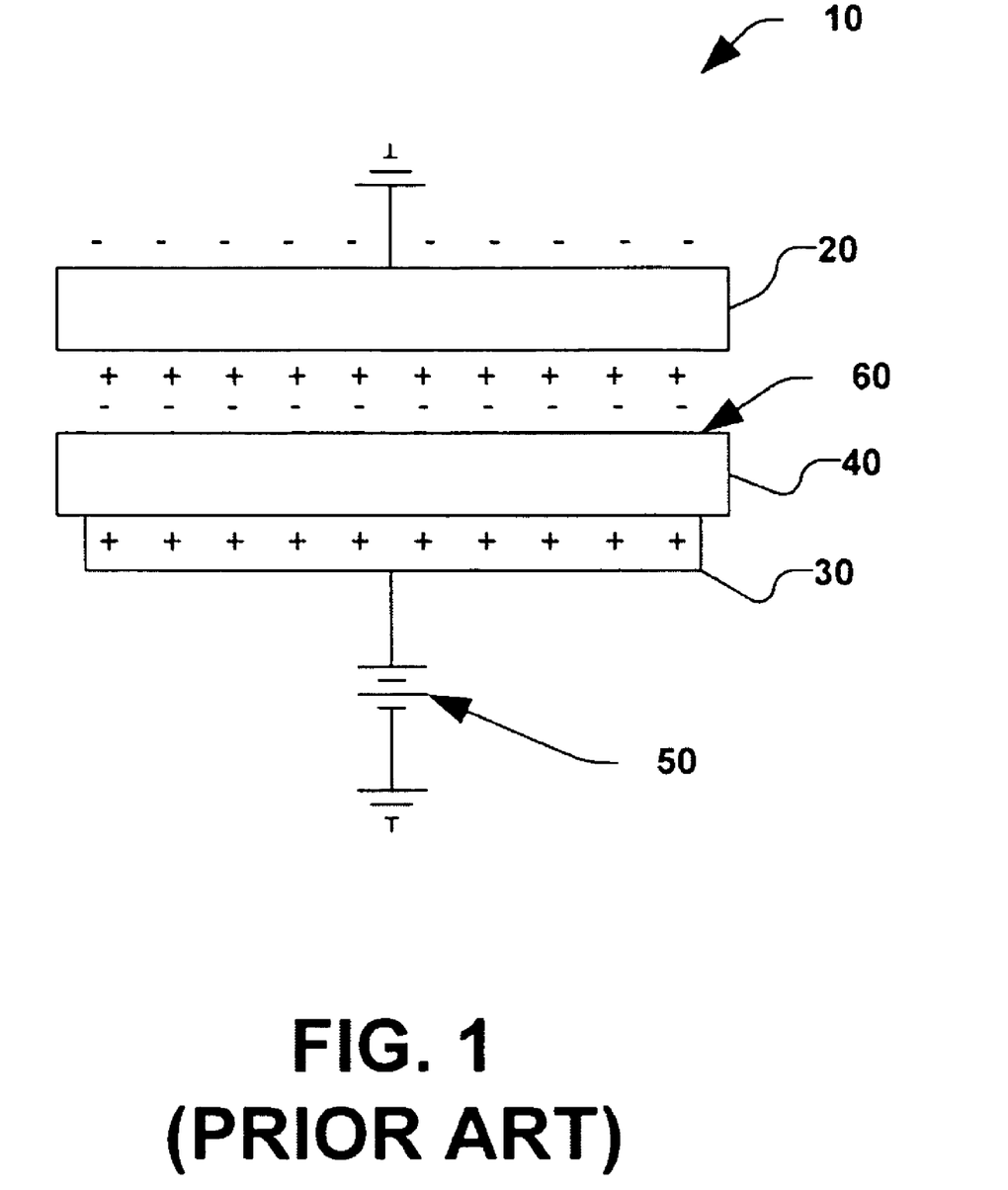
FIG. 1 is a partial cross-sectional view of an exemplary prior art electrostatic chuck.

Wafer temperature control in semiconductor processing has utilized electrostatic chucks (ESCs) for some time. A typical single-polar ESC is illustrated in FIG. 1, wherein the ESC 10 holds the wafer 20 in place by electrostatic force. The wafer 20 is separated from an electrode 30 by an insulating layer 40. A voltage (e.g., illustrated as a+) is applied to the electrode 30 by a voltage source 50. The voltage applied to the electrode produces an electrostatic field (e.g., illustrated as a"−") at the wafer 20 which induces an equal and opposite charge (e.g., illustrated as a+) on the wafer 20. The electrostatic field on the wafer 20 produces an electrostatic force between the wafer and the ESC 10. Consequently, the electrostatic force holds the wafer 20 against the insulating layer 40.

Cooling of the wafer 20 can occur through contact conductivity between the wafer and a contact surface 60 of the insulating layer 40, wherein the insulating layer may be cooled by cooling water. Conventionally, the cooling of the wafer 20 generally increases with the voltage applied to the ESC. Significantly high voltages, however, can have deleterious effects on the wafer (e.g., a cause of particle generation), and may further have costly power supply and consumption considerations, along with increased failure rates.

In vacuum environments, conventional ESCs utilize a cooling gas between the wafer 20 and the insulating layer 40, wherein a contact surface 60 of the insulating layer 40 comprises a region for the cooling gas to reside. However, conventionally machining an insulating layer 40 comprised of a ceramic typically has several drawbacks, both in terms of precision, as well as potential particulate concerns caused by the ceramic layer during wafer processing.

A thickness of the insulating layer 40 between the clamp electrode 30 and the wafer 20 affects a local clamping force, thereby impacting thermal uniformity across the wafer. Conventional manufacturing methods provide poor control over this dimension, however. Non-uniformities in the insulating layer 40 and the physical gap between the clamp 10 and wafer 20 produce potentially large spatial variations in clamping pressure, making precise temperature control difficult. Models and measurements indicate that, conventionally, an average gap width typically varies depending on the surface and clamping conditions. This relatively large and uncontrollable gap width across the wafer typically results in a lower cooling capability and a non-uniform temperature across the wafer.

When using an ESC, the entire back side of the wafer can be held tightly to the surface of the ESC. Particulates are created when two hard surfaces are held together in this manner due to the crushing of micro-features of the surfaces. Therefore, the interface between the surfaces of the ESC and wafer becomes a source for particulate generation.

Thus, there is a need in the art for an electrostatic chuck that provides a clamping surface which is operable to significantly limit particulate contamination during wafer processing.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed to an apparatus and method for forming a clamping plate for an electrostatic chuck (ESC) for heating or cooling a semiconductor substrate. A compliant layer can be coated over the ESC for providing a reduced coefficient of friction for substantially reducing or eliminating particulates generated from thermal expansion between the ESC and the backside of a substrate (e.g., a semiconductor wafer). The topography of the compliant layer can be patterned and can also be conformal to the topography of the ceramic of the ESC. The compliant layer can comprise any soft, pliable yet resilient material, such as organic silicide, a fluoropolymer, and/or TT-Kote®.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

The present invention is directed towards an electrostatic chuck (ESC), such as a multi-polar ESC and an associated method for forming a clamping plate therefor that incorporates several inventive features thereof. In particular, the electrostatic chuck of the present invention decreases particulate generation through reduced friction coefficients and increases an ability to uniformly cool a wafer substrate. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

One challenge overcome by the present disclosure is achieving a reduction in friction of the surface of an ESC while allowing the ESC to have multi-polar and/or uni-polar clamps (e.g., wherein the entire ESC is one electrode). A coating on the surface of the ESC with a soft/compliant material, such as TT-Kote® can be applied so that rubbing effects from thermal expansion can be eliminated. This coating on the surface of the ESC can be a compliant layer over the ESC to provide a substantially non-stick or low friction surface on which the backside of the wafer contacts.

Another challenge overcome by the present disclosure is achieving an electrostatic chuck (ESC) that exhibits a significantly spatially uniform heat transfer coefficient (HTC) between a substrate (e.g., a silicon wafer) and a semiconductor clamping plate associated with the ESC. One approach to obtaining a significantly uniform HTC is to utilize thermal contact conductivity between the substrate and the clamping plate, wherein a voltage applied to the clamping plate generally determines an amount of contact force between the substrate and the clamping plate. HTC uniformity, however, is typically dependent on contact pressure uniformity.

One way of maintaining a uniform HTC is to provide a uniform clamping surface. A solid clamping surface, however, generally requires a large contact pressure across the substrate, and thus, a large amount of power applied to the ESC in order to attain a significantly high HTC. Removing a portion of the clamping surface in accordance with the present invention allows for a reduction in power, while reducing the force on the wafer. For example, an area of the clamping plate surface is removed, wherein the remaining portions generally define a plurality of protrusions whereon the substrate resides. In accordance with one aspect of the disclosure, an area ratio between a contact surface area of the clamping plate and a surface area of the substrate is utilized, wherein a maximum heat transfer can take place through the plurality of protrusions, while minimizing stress to the substrate.

Figure 2:
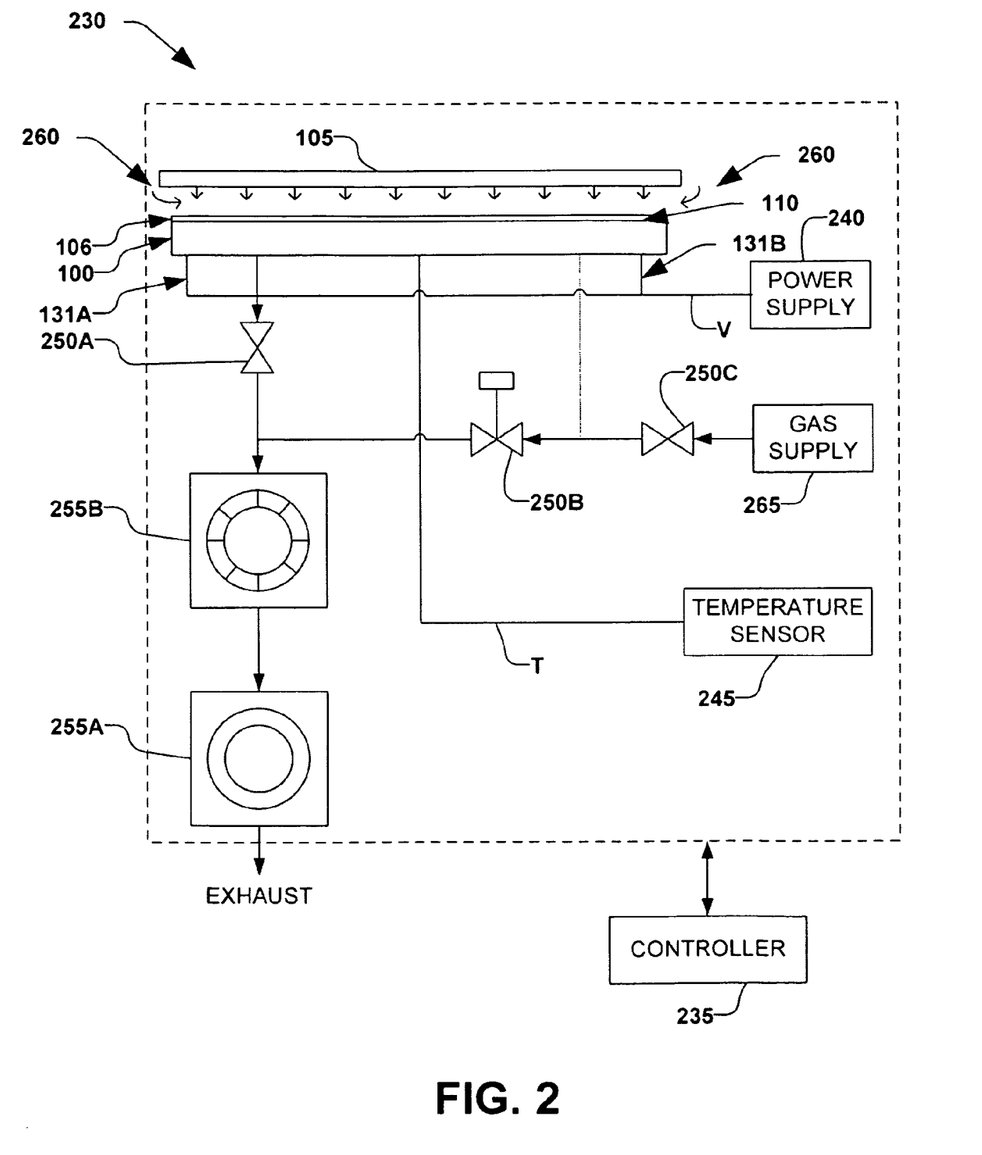
FIG. 2 is a partial cross-sectional view of an electrostatic chuck according to one exemplary aspect of the present invention.

FIG. 2 is a block diagram of the electrostatic chuck 100 and a related system 230 is illustrated according to several aspects of the disclosure. According to one exemplary aspect of the present invention, the system 230 for controlling the electrostatic chuck 100 can comprise a controller 235 operatively coupled to a voltage power supply 240. The controller 235 can be operable to control the voltage V supplied to the poles 131A, 131B of the ESC 100 by controlling the voltage supply 240, wherein the voltage is proportional to an amount of clamping force seen by the substrate 105 due to electrostatic forces induced by the voltage. According to one example, the controller 235 can further control an amount of contact heat transfer coefficient (HTC) of the ESC 100 by increasing or decreasing the voltage V, whereby the electrostatic force, and hence the clamping force, is respectively increased or decreased. According to the above example, controlling the voltage V applied to the electrostatic chuck 100 of FIG. 2 advantageously controls the amount of thermal conduction through the clamping plate. At the low contact pressure, the substrate 105 is still clamped or secured, but a minimal amount of thermal energy is transferred between the substrate and the electrostatic chuck 100, wherein a thermal portion of the chuck is substantially "off". When the larger voltage V (e.g., approximately 100 volts) is applied to the ESC 100, the contact pressure between the substrate 105 and the clamping plate 110 is substantially increased, thereby quickly increasing the HTC between the substrate 105 and the clamping plate 110, and thus effectively turning the thermal portion of the chuck "on" for heating or cooling the substrate.

The controller 235, in this example, can be operable to control the contact pressure by quickly controlling the voltage V applied to the ESC 100, thereby allowing the ESC to quickly change states (e.g., from a heating condition to a cooling condition). The controller 235, for example, can be further operable to feed back wafer temperature data T from a temperature sensor 245 associated with the ESC, wherein the voltage supply 240 can be controlled in a closed-loop feedback arrangement. Alternatively, the controller 235 is operable to generally limit the HTC between the substrate 105 and the ESC 100 when a predetermined temperature is reached.

According to another exemplary aspect, the system 230 of FIG. 2 further can comprise one or more valves 250A-250C, wherein the one or more valves are operable to selectively permit one or more vacuum pumps 255 to pump the cooling gas 260 through the electrostatic chuck 100 in various modes for gas thermal conductance between the substrate 105 and the ESC. The one or more valves 250A-250C, for example, comprises one or more automatic valves (e.g., valve 250A) such as fast-acting solenoid valves or poppet valves.

According to another exemplary aspect, the controller 235 can be operatively coupled to the one or more vacuum pumps 255A-255B, a gas supply 265, the voltage supply 240, and the one or more valves 250A-250C. Controlling the vacuum applied to the electrostatic chuck 100 in the present example advantageously controls an amount of thermal conduction through the cooling gas. Therefore the valve 250A that controls the backside pressure allows the electrostatic chuck 100 to quickly change states (e.g., from a heating condition to a cooling condition). The controller 235, therefore, is further operable to control a gas pressure between the substrate 105 and the electrostatic chuck 100 via controlling the one or more automatic valves 250.

In another embodiment, an enlarged partial cross-sectional view a compliant layer 106 is illustrated as deposited over the ESC 100. The compliant layer 106 is enlarged and is not shown to scale in order to facilitate an understanding of the structure and its operation. The compliant layer 106 can be coated onto the ESC 100 and comprise any soft/compliant, yet resilient surface for reducing backside particulates when clamping a semiconductor substrate thereon. In one embodiment, the compliant layer 106 can comprise a soft compliant material, such as organic silicide, and comprise a thickness from about 1 micron to about 5 microns, for example, one micron. The thickness may be predetermined as a function of clamping force required for clamping the substrate on the ESC 100. As the thickness increases or decreases, electrostatic forces can also increase or decrease depending upon the resistivity of the compliant layer 106, for example.

In another embodiment, the compliant layer 106 can comprise any soft, pliable yet resilient material, such as an organic silicide. In another embodiment, the compliant layer 106 can comprise a TT-Kote®, a product of NxEdge to provide a pliable surface. The compliant layer 106 is operable to reduce backside particles when clamping a semiconductor wafer or substrate. In another embodiment, the compliant layer 106 can comprise a fluoropolymer (e.g., PTFE, PTFE like coatings), such as a Teflon®. By coating the ESC 100 with the complaint layer 106, the surface of the ESC 100 can exhibit reduced friction coefficients, and thus the particle generation from the clamping and rubbing effect from thermal expansion can be eliminated or reduced.

Further, the compliant layer can comprise a substantially non-stick or low friction/low adhesion clamping surface upon which the substrate backside may contact. In one embodiment, the clamping surface can be substantially planar, as shown in FIG. 2. The compliant layer 106 can be conformal to the surfaces of the ESC 100, and thus, overlay various topographies of the ESC 100 suitable for clamping the substrate 105. For example, the ESC 100 can comprise a ceramic member that provides surface features, such as island protrusions thereon, fibrous patterns, or any topography suitable for contacting the substrate 105.

In another embodiment, the compliant layer 106 can be shaped to provide a non-coplanar surface with respect to the surface of the ESC 100. The compliant layer can be pliable and resilient so that various features for contacting the substrate 106 may be shaped therein. For example, island protrusions, fibrous patterns, or any topography suitable for contact the substrate 105.

Removing portions of the surface to provide a non-coplanar clamping surface (either by shaping the compliant layer or the surface of the ceramic for coating the compliant layer to conform thereon) reduces the compliant layer backside particles. In addition, cooling can typically be reduced because of the reduction of contact area with the wafer backside, but this can also typically improve gas distribution behind the wafer and cooling uniformity.

Figure 3:
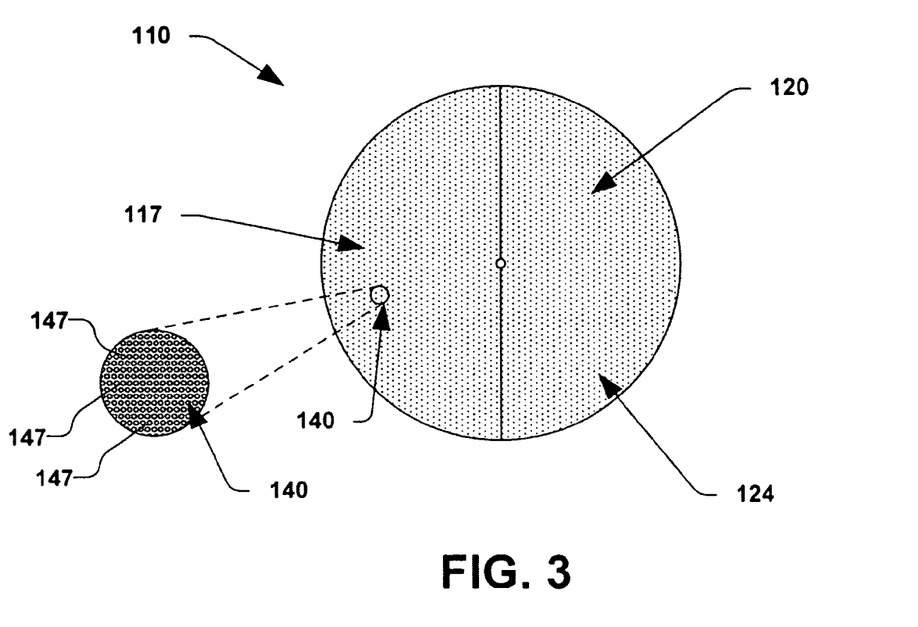
FIG. 3 is a plan view of an exemplary clamping plate according to one exemplary aspect of the present invention.

Referring now to FIG. 3 illustrates one embodiment in which a plurality of protrusions 140 comprising a plurality of substantially cylindrical or rectangular islands 147 which have been formed over the top surface 117 of a clamping plate 110 of an ESC. The plurality of protrusions 140 are operable to generally contact the bottom surface of the substrate 105 illustrated in FIG. 2, thereby defining a protrusion contact area. Although the plurality of protrusions 140 extending from the top surface 117 of the clamping plate 110 are illustrated as being of uniform shape and arranged in an ordered manner, other arrangements of the plurality of protrusions are also contemplated, and any shape or order of protrusions or other such alternatives are contemplated as falling within the scope of the present invention.

The clamping plate 110, for example, comprises a semiconductor platform 120, wherein a compliant layer 124 comprising a low friction/adhesion surface is formed over a top surface of the semiconductor platform. The compliant layer 124 can comprise a fluoropolymer, organic silicide or TT-Kote®. The compliant layer can be pliable to conform to the surface of the ESC and/or shaped to provide surface features therein.

Figure 4:
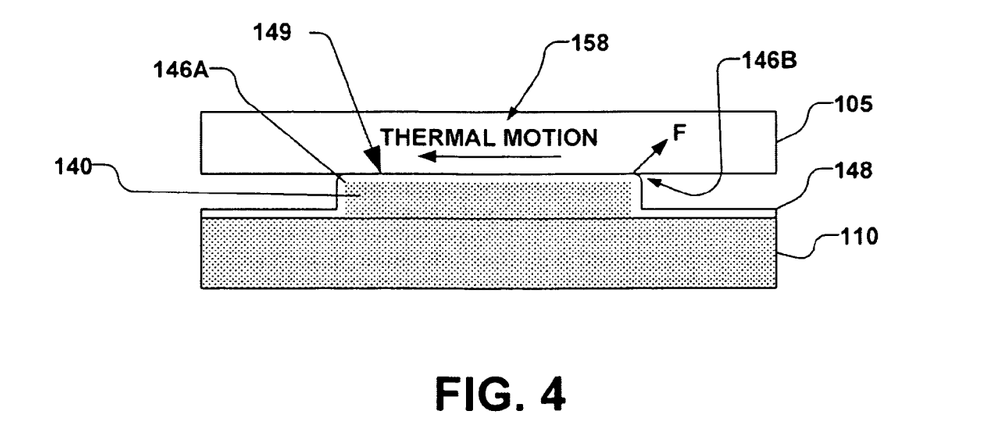
FIG. 4 is a partial cross-sectional view of an exemplary protrusion according to an aspect of the present invention.

FIG. 4 illustrates an exemplary protrusion 140, wherein a compliant layer 148 generally conforms to the plurality of the protrusions 140 and has generally rounded the one or more sharp edges 146A, thereby defining one or more rounded edges 146B of the protrusion. The compliant layer 148, for example, can provide advantageous sliding characteristics during a thermal motion (e.g., a thermal expansion or contraction) of the substrate 105 with respect to the clamping plate 110. For example, the thermal motion 158 of the substrate 105 relative to the protrusion 140 can create a force F on the substrate 105 by the protrusion 140.

The compliant layer 148, for example, can have a low emissivity, wherein heat emitted from the substrate (not shown) toward the clamping plate 110 can be reflected from the protective coating during a heating of the substrate, thereby encouraging thermal conduction to occur through gas conduction in the gaps (when gas conductivity is utilized). According to another example, the compliant layer 148 provides a substantially compliant interface 149 between the clamping plate 110 and the substrate 105, wherein the compliant layer generally decreases the possibility of contamination from friction causing degradation of the clamping plate and the backside of the substrate 105. The compliant layer 148 therefore allows for expansion to occur in a more uniform manner otherwise because of the pliability of the compliant layer 105. According to yet another example, the compliant layer 148 is operable to generally permit the substrate 105 to slide laterally over the interface 149 between the clamping plate 110 and the substrate. The compliant layer 148 generally conforms to the plurality of the protrusions 140, thereby rounding one or more sharp edges 146A thereof, and can provide a low friction/low adhesion surface for reducing a coefficient of friction between the substrate and interface 149.

Figure 5:
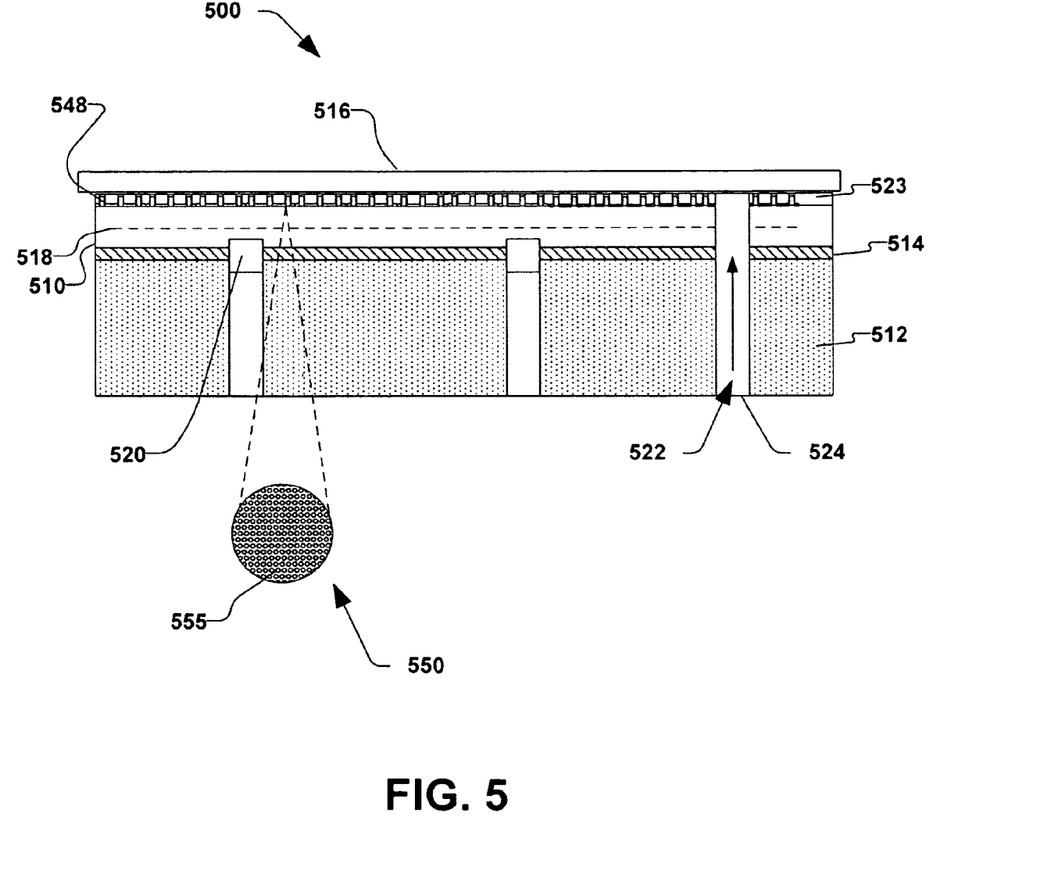
FIG. 5 is a partial cross-sectional view of an exemplary clamping plate according to one exemplary aspect of the present invention.

Referring now to FIG. 5, illustrates an electrostatic chuck 500 comprising an electrostatic chuck ceramic member 510, metal member 512. The electrostatic chuck ceramic member 510 can be comprised of a ceramic material, for example, aluminum nitride (AlN), alumina ($Al_2O_3$), calcium titanate ($CaTiO_3$), or barium titanate ($BaTiO_3$), and also comprised of aluminum nitride (AlN). An electrostatic chuck electrode 518 can be embedded in the electrostatic chuck ceramic member 510, such as by sintering or other method appreciated by one of ordinary skill in the art. The surface of the electrostatic chuck member 510 can be charged by applying a voltage to the electrostatic electrode 518 through the terminal 520, resulting in the generation of electrostatic attraction, with which attraction silicon wafer 516 can be adsorbed on the adsorption surface, the upper surface of the electrostatic chuck ceramic member 510. Additionally, in the electrostatic chuck member 150 and metal member 512 of the electrostatic chuck having a bonded structure 514, one may make a hole 524 to pass a cooling medium 522, for example, argon gas (Ar gas), nitrogen gas (N2 gas) and the like. Further, instead of this, or in addition to this, the metal member 512 may be provided with another cooling mechanism, for example, a water cooling mechanism and/or any other method appreciated by one of ordinary skill in the art.

In addition, in one embodiment a coating or compliant layer 523 can provide a larger surface area than the back surface of wafer 516. The difference in areas can allow gas molecules to statistically bounce multiple times within features 548, such as with folds, for example, of the heat sink surface. The topography of the compliant layer 523 can be patterned to comprise a topography that causes the contact ratio of the layer to the substrate to be less than 100%. The topography of the compliant layer 523 can also comprise features 548 that comprise folds, grooves, microdots and/or island protrusions 548 for contact that give the complaint layer a contact ratio less than 100% with respect to the backside of the wafer 516. The islands can be substantially cylindrical and/or substantially rectangular in geometry and be formed from the compliant layer 523.

In another embodiment, the compliant layer 523 can be shaped to provide a non-coplanar surface with respect to the surface of the ceramic member 510, such as illustrated in FIG. 5. For example, the compliant layer 523 topography can be shaped within to form various features 548, such as folds, island protrusions, microdots and/or fibrous web patterns therein for supporting the backside of the wafer 516. The compliant layer 523 may be conformal to the surfaces of the ceramic member 510 for providing features 548, and can also be shaped itself to provide various features 548, such as folds, grooves, microdots, and/or island protrusions 548. Any features 548 suitable for contacting the backside of the wafer 516 are envisioned as being within the scope of the disclosure.

Further, the compliant layer 523 can comprise a low friction clamping surface upon which the substrate backside may contact. In one embodiment, the clamping surface can be substantially planar with respect to surface features 548 formed by the surface of the ceramic member 510 and not have any protrusions or patterns within itself, but shaped to the various topographies of the ceramic member 510 underneath. For example, features 548 such as grooves, island protrusions, microdots, and/or folds within the ceramic member 510 may be coated with the compliant layer 523 and made to shape the complaint layer 523.

In another embodiment, the features 548 can be formed from the ceramic member 510 and additionally have features thereon shaped within the compliant layer 523. A zoomed in view 550 of surface features 555 can be seen in FIG. 5, for example. The features 555 can be formed from the compliant layer 510 material and reside above the features 548 that can be formed from the ceramic member 510. For example, the compliant layer 523 can comprise micro-dots that are scattered above features 548 that can be formed from the ceramic member 510. As discussed above, the features 548 can be either formed from the ceramic member 510 and/or from the ceramic layer 523 material, and are any suitable features for contacting the substrate to reduce contact area of the wafer to the ESC where particles can be generated.

In one embodiment, the compliant layer may have a thickness in a range of about 1-5 microns, for example, about 2 microns can be utilized. The thickness may be predetermined as a function of clamping force required for clamping the substrate on the ESC 500. As the thickness increases or decreases, electrostatic forces can also increase or decrease depending upon the resistivity of the compliant layer 523.

In one embodiment, the compliant layer 523 may comprise teflon or PTFE like coatings. The compliant layer 523 can comprise a soft compliant material, such as organic silicide or TT-Kote® to provide a pliable surface that reduces backside particles when clamping a semiconductor wafer or substrate. In another embodiment, the compliant layer 523 can comprise a fluoropolymer (e.g., PTFE, PTFE like coatings), such as a Teflon®. By coating the ESC 500 with the complaint layer 523, the surface of the ESC 500 can exhibit reduced friction coefficients, and thus the particle generation from the initial clamping and rubbing effect from thermal expansion can be eliminated or reduced.

In one embodiment, the compliant layer 523 can comprise nanofibers coated within by organic silicide or TT-Kote® for providing greater surface area and/or clamping force thereon, as well as pliability throughout. The folds or island protrusions 548 can be scattered nanofibers that form a web like pattern within the layer 523. Any pattern suitable for contacting the backside of the wafer 516 can be embodied therein.

The present disclosure is also directed toward a method for forming a semiconductor-based multi-polar electrostatic chuck. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 6:
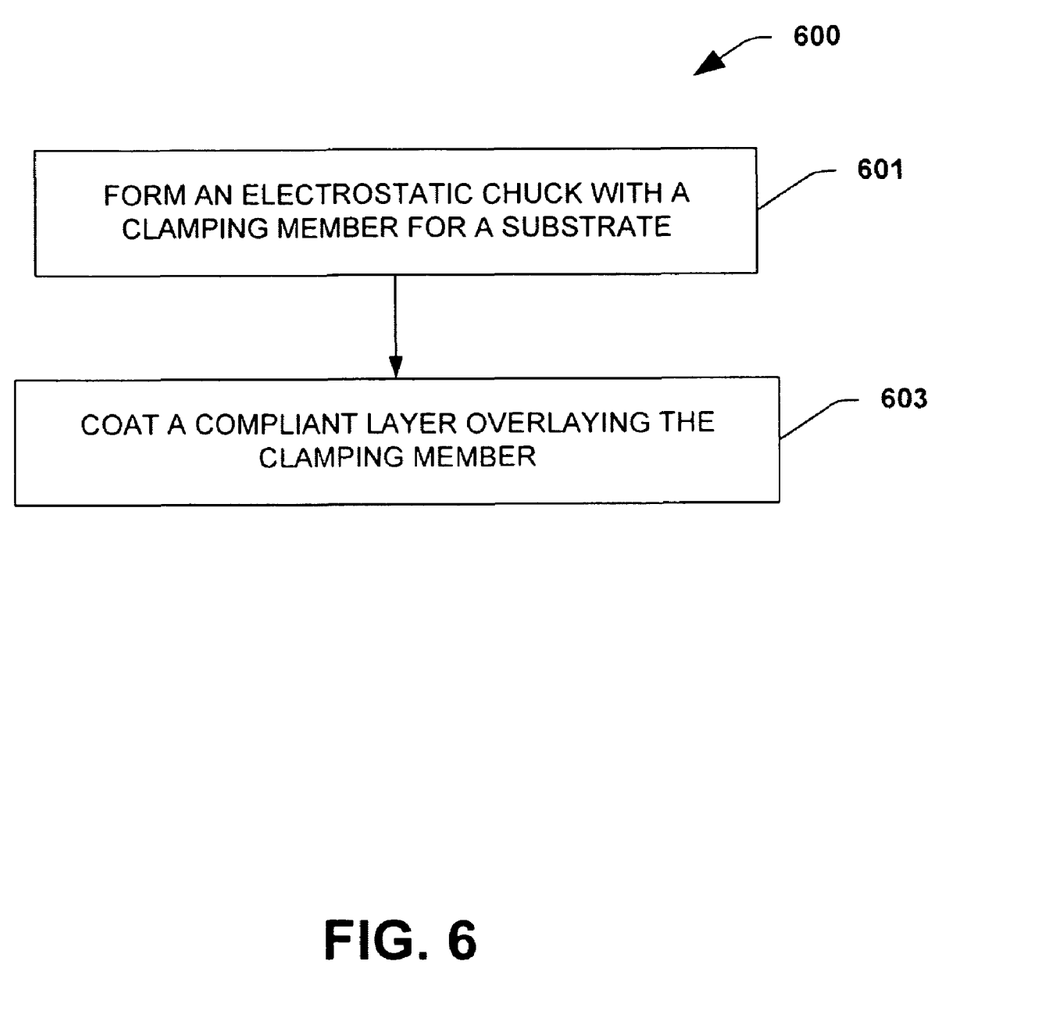
FIG. 6 is a flow chart diagram illustrating an exemplary methodology for forming a semiconductor-based electrostatic chuck according to the present invention.

Referring now to FIG. 6, a method 600 of forming a clamping plate for an electrostatic chuck is illustrated, wherein the clamping plate comprises a compliant layer resilient to allow thermal transfer between the backside of a semiconductor wafer and a ceramic member of an ESC, as well as reduce particulates generated thereon. The surface comprises a low friction surface that is pliable and compliant with the surfaces of the wafer and ceramic member. The compliant layer can be sufficient to reduce friction coefficients because it is pliable enough to reduce rubbing that occurs from thermal expansion. Consequently, particulate generation is reduced or eliminated substantially.

Beginning with act 601, a clamping member is formed for an ESC that can comprise a ceramic member that may comprise various ceramics (e.g., AlN) and materials (e.g., metal electrode with or without nanofibers) for clamping a wafer to its surface. A compliant layer (as discussed supra) is coated overlaying the surface of the ceramic (e.g., ceramic member) at 603. The compliant layer may be substantially planar and uniform to the surface of the ceramic, and can be conformal to various topographies patterned within the ceramic surface. In another embodiment, the compliant layer itself is patterned with various protrusion islands, and/or fibrous shapes sufficient for contacting the backside of the wafer. In another example, the compliant layer can comprise organic silicide or TT-Kote® for a low friction and resilient surface to be contact the backside of the wafer. Nanofibers can be coated within the compliant layer for providing greater surface area and more pliability throughout. At 605 a wafer is held to the surface of the ESC.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrostatic chuck for clamping a substrate and controlling a heat transfer associated therewith, the electrostatic chuck comprising:
   a ceramic member comprising a ceramic surface; and
   a compliant layer comprising a low friction surface overlying the ceramic surface, therein providing a clamping surface for clamping the substrate, wherein the compliant layer comprises nanofibers coated with an organic silicide.

2. The electrostatic chuck of claim 1, wherein the compliant layer comprises a width of 1 micron to about 5 microns.

3. The electrostatic chuck of claim 1, wherein the ceramic member comprises an aluminum nitride base material.

4. The electrostatic chuck of claim 1, wherein the compliant layer comprises a topography pattern that causes the contact ratio of the compliant layer to the substrate to be less than 100%, and wherein the ceramic surface underneath the compliant layer comprises substantially a planar surface.

5. The electrostatic chuck of claim 1, wherein the topography of the compliant layer comprises a topography patterned with islands of contact that give the compliant layer a contact ratio less than 100%.

6. The electrostatic chuck of claim 1, wherein the compliant layer is conformal to the ceramic surface of the ceramic member, and wherein the ceramic surface underlies the compliant layer and does not comprise a planar surface, and wherein the ceramic surface comprises a topography pattern that causes the contact ratio of the compliant layer to the substrate to be less than 100%.

7. The electrostatic chuck of claim 1, wherein the compliant layer comprises a thickness of 1 micron to 5 microns as a function of clamp force sufficient for clamping the substrate.

8. The electrostatic chuck of claim 1, wherein the ceramic member comprises grooves and the compliant layer conforms to the grooves of the ceramic member.

9. The electrostatic chuck of claim 1, wherein the compliant layer comprises a fluoropolymer coat.

10. The electrostatic chuck of claim 1, wherein the compliant layer comprises a thickness of 1 micron to 5 microns as a function of clamp force sufficient for clamping the substrate, wherein a topography of the compliant layer comprises a plurality of features extending therefrom and underlying the compliant layer for contacting the substrate, wherein the features comprise the ceramic material, the compliant layer material, or both the ceramic material and the compliant layer material, and wherein the features comprise folds, grooves, microdots, and/or island features separate from one another for contacting the substrate.

11. The electrostatic chuck of claim 10, wherein the folds and/or island features comprise scattered nanofibers, therein defining a web-like pattern within the compliant layer.

* * * * *